United States Patent [19]
Wollesen et al.

[11] Patent Number: 5,824,586
[45] Date of Patent: Oct. 20, 1998

[54] METHOD OF MANUFACTURING A RAISED SOURCE/DRAIN MOSFET

[75] Inventors: Donald L. Wollesen, Saratoga; Deepak Nayak, Santa Clara, both of Calif.

[73] Assignee: Advanced Micro Devices, Inc., Sunnyvale, Calif.

[21] Appl. No.: 735,464

[22] Filed: Oct. 23, 1996

[51] Int. Cl.⁶ .................................................. H01L 21/28
[52] U.S. Cl. .................... 438/300; 438/486; 438/664; 148/DIG. 19
[58] Field of Search ................................ 438/300, 301, 438/305, 308, 486, 664, 683, 655, 177, 193, 196, 360; 148/DIG. 19, DIG. 147

[56] References Cited

U.S. PATENT DOCUMENTS

| | | |
|---|---|---|
| 4,789,644 | 12/1988 | Meda . |
| 5,079,180 | 1/1992 | Rodder et al. . |
| 5,250,454 | 10/1993 | Maszara et al. .................. 438/300 |
| 5,314,832 | 5/1994 | Deleonibus ........................ 438/300 |
| 5,496,750 | 3/1996 | Moslehi . |
| 5,637,518 | 6/1997 | Prall et al. ........................ 438/308 |

FOREIGN PATENT DOCUMENTS 8-18049  1/1996  Japan .

OTHER PUBLICATIONS

S Wolf, "Silicon Processing for the VLSI Era" vol. II, pp. 144–149, Jun. 1990.

*Primary Examiner*—Trung Dang
*Assistant Examiner*—Leon Radomsky
*Attorney, Agent, or Firm*—H. Donald Nelson

[57] ABSTRACT

A method of manufacturing a raised source/drain MOSFET by depositing amorphous silicon on the partially formed MOSFET having the gate and gate oxide spacers formed, ion implanting to form the appropriate source/drain junctions, annealing wherein epitaxial growth takes place in regions where the amorphous silicon is over silicon, and etching the remaining amorphous silicon. A layer of refractory metal is deposited and a second anneal converts the refractory metal overlaying silicon to silicide.

8 Claims, 3 Drawing Sheets

METHOD OF MANUFACTURING A RAISED SOURCE/DRAIN MOSFET

BACKGROUND OF THE INVENTION

1. Field of the Invention

This invention relates generally to the manufacture of high performance semiconductor devices and, more particularly, to the manufacture of submicron semiconductor devices and, even more particularly, to the manufacture of a submicron MOSFET having raised source/drain regions and shallow source/drain junctions.

2. Discussion of the Related Art

The semiconductor industry is increasingly characterized by a growing trend toward fabricating larger and more complex circuits on a given semiconductor chip. This is being achieved by reducing the size of individual devices within the circuits and spacing the devices closer together. The reduction of the size of individual devices and the closer spacing brings about improved electrical performance.

There is increasing interest in MOS integrated circuits in which the component devices have gate dimensions as small as 0.35 $\mu$m or less. Devices having such small dimensions suffer from certain problems that are not of serious concern when the gate dimensions are greater than about 1 $\mu$m.

Two of the major goals of MOSFET scaling are to increase the density and the speed of the integrated circuits in which the scaled-down devices are to be used. To increase density, the physical dimensions of each integrated circuit have to be reduced which means smaller channel lengths and widths. As the physical dimensions of the integrated circuit reached the submicron regime all of the device parameters that affect performance of the integrated circuit have become extremely critical. One of the parameters that has become critical is the contact technology used in these integrated circuits. The contact technology is critical because as silicon integrated circuits are fabricated, isolated active regions are created within the single-crystal substrate. These active regions must be connected to other regions of the device. These connections are made with high-conductivity, thin-film structures which are fabricated above an insulator which has been fabricated above the active regions. Whenever a connection is needed between a conductor film and one of the active regions, an opening in the insulator must be provided to allow such a contact to occur. Interconnections in ideal electric circuits are assumed to have zero impedance, however, in real conductor structures the finite impedance must be considered and in the case of semiconductor integrated circuits there are parasitic resistances that can significantly impact device performance that must be considered in circuit design.

In the planar MOSFET, the device region in which the transistor action occurs is the channel region under the gate. There is a channel resistance, $R_{CH}$, associated with current flow in the channel. In addition to the channel resistance, there is a parasitic series resistance, $R_S$, because the current flowing from the metal-interconnect must be transported to and from the channel region through the drain and source region. In the MOSFET, current enters the contact perpendicular to the wafer surface, and then travels parallel to the surface in order to reach the channel. The parasitic series resistance, $R_S$, of the current path from the contact to the edge of the channel is modeled by the sum of four components as follows:

$$R_S = R_{oc} + R_{sh} + R_{sp} + R_{ac}$$

where $R_{oc}$ is the contact resistance between the metal and the source/drain region, $R_{sh}$ is the sheet resistance of the bulk region of the source and the drain, $R_{sp}$ describes the resistance of the current lines crowding near the channel end of the source, and $R_{ac}$ is the accumulation-layer resistance.

As transistor dimensions approached 1$\mu$, the conventional contact structures began to limit device performance in several ways. First, it was not possible to minimize the contact resistance, $R_{oc}$, if the contact hole was also of minimum size, and problems with cleaning the small contact holes became a concern. In addition, the area of the source/drain regions could not be minimized because the contact hole had to be aligned to these regions with a separate masking step, and extra area had to be allocated for misalignment, however, the extra area resulted in increased source/drain-to-substrate junction capacitance, which decreased the speed of the device. When nonminimum-width MOSFETs were manufactured with conventional contacts, several small, uniform sized contact holes were usually used rather than one wider contact hole. The problem with using several small, equally sized contact holes rather than one wider one, was that the full width of the source/drain region was thus not available for the contact structure. As a result the device contact resistance was proportionally larger than it would have been in a device having minimum width.

A number of alternate contact structures have been proposed in an effort to solve the problems associated with shrinking the device. Two of the most important proposals are 1) self-aligned silicides (salicides) on the source/drain regions; and 2) an elevated source/drain structure obtained by selectively depositing silicon onto the exposed source/drain regions.

The first alternative to using the conventional contact structure is to contact the entire source and drain regions of the MOSFET with a conductor film. This alternative is illustrated in FIG. 1 in which a MOSFET 10 is shown with polycide regions 38 on the source region 34 and the drain region 36 as well as on the polysilicon gate 22. The method to form the MOSFET 10 in FIG. 1 is called a self-aligned process since it does not require any additional masking steps. The process is as follows: 1) after the source region 34 and the drain region 36 have been implanted to form source/drain junctions, the polysilicon sidewall spacers 24 and 26 are formed; 2) the metal used to form the silicide is deposited and the wafer is heated, which causes the silicide reaction to occur wherever the metal is in contact with the silicon; and 3) the unreacted metal not in contact with silicon is selectively removed through the use of an etchant that does not attack the silicide, the silicon substrate, or the silicon dioxide. The result is that each exposed source, drain, and gate region are completely covered by a silicide film. The next steps in the process, not shown in FIG. 1, is that a dielectric film is then deposited onto the silicide, and contact holes are opened in the dielectric film down to the silicide layer after which metal is deposited into the contact holes to make contact with the silicide.

The silicides that have been the most successful in semiconductor integrated circuit manufacturing have been titanium silicide and cobalt silicide. These two silicides exhibit the desired low resistivities and can withstand process temperatures in excess of 800° C.

The silicide process exhibits a limitation related to the fact that the gate and the source/drain silicides are sometimes formed at the same time. On the gate, it is desirable for the silicide to have the lowest possible sheet resistance so that the gate electrode will also have a low interconnect resistance. To achieve the low interconnect resistance, it is necessary for the gate to have a thick silicide layer. Over the source/drain regions, however, the silicide can only be of limited thickness, in order to prevent excess consumption of the substrate silicon by silicide formation. Thus, prior art methods which provide a thicker silicide on the source/drain regions are detrimental to contact formation on these regions. A solution to this problem is to use a two step method in which the silicide is formed on the gate level first and on the contact regions at a later stage in order to achieve a different thickness. Another problem is that it is difficult to metallize shallow junctions less than or equal to 200 nm because of the junction leakage that is observed when the silicidation process is used. This is caused by the implant damage caused during the source/drain junction formation. The damage may not be sufficiently annealed-out by the lower-temperature silicide-formation step and the damaged region may remain within the depletion region of the shallow junction, giving rise to higher leakage.

The second proposed method of solving the problem associated with shrinking the MOSFET involves selective growth of silicon and diffusion of the implanted dopants to form the junctions. In this approach, silicon is selectively grown (SSG) over the source/drain regions of the MOSFET to a depth of 200–400 nm, following the completion of oxide-spacer formation. For example, a reduced-pressure, 900° C. process using $SiH_2Cl_2$—HCl gas is employed for the SSG step which produces raised source/drain regions. In one proposal, a $BF_2+$ implant into the SSG film is followed by a 1050°–1075° C. RTP (rapid thermal process) step to form a low resistance (60 ohm/square) shallow junction (100 nm deep). In another proposed method, a phosphorus implant into the SSG layer is performed so that a gradual-drain $n^+$ junction can be formed to reduce hot-carrier degradation. Non-selectively deposited polysilicon has also been used as a dopant source for shallow-junction formation.

The problems with the above proposed methods of achieving elevated source/drain regions is that some of the problems have been overcome, but at the cost of introducing a more complex process for formation of the gate structure.

What is needed is a method of manufacturing a MOSFET having raised source/drain regions that does not add undue complexity to the manufacturing process.

SUMMARY OF THE INVENTION

The invention is directed to a method of manufacturing a MOSFET with a raised source and drain. The method includes depositing amorphous silicon on the MOSFET structure after the gate oxide, gate, and gate spacers have been formed. An ion implant is done through the amorphous silicon to form the appropriate source and drain junctions. The device is annealed and the amorphous silicon overlaying silicon forms epitaxial silicon. The remaining amorphous silicon on areas without underlying silicon is removed and a layer of a refractory metal is deposited on the device. The device is annealed and the refractory metal overlaying silicon forms silicide.

The present invention is better understood upon consideration of the detailed description below, in conjunction with the accompanying drawings. As will become readily apparent to those skilled in this art from the following description there is shown and described a preferred embodiment of this invention simply by way of illustration of the mode best suited to carry out the invention. As it will be realized, the invention is capable of other different embodiments, and its several details are capable of modifications in various, obvious aspects all without departing from the scope of the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION

Figure 1:
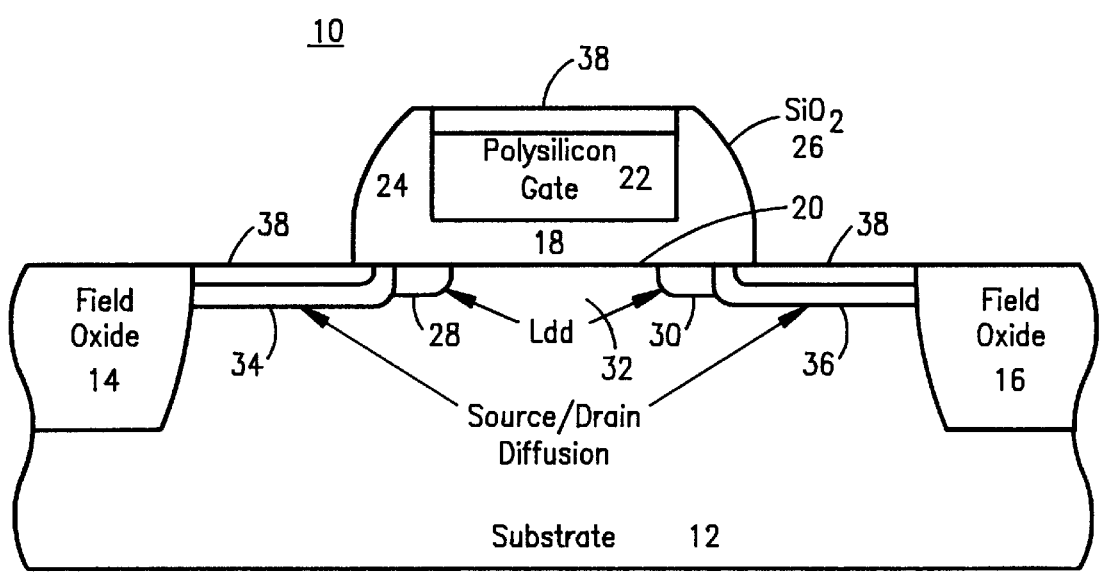
FIG. 1 shows a prior art device.

Referring now to FIG. 1 there is shown a conventional salicide semiconductor device 10 as known in the prior art. The semiconductor device 10 includes a substrate 12 and regions of an insulator, shown as field oxide regions 14 and 16. A gate oxide region 18 is formed on the top surface, indicated at 20, of the substrate 12. A gate 22 is formed on the gate oxide region 18. Sidewall spacers 24 and 26 are formed adjacent to the gate 22. Two regions, indicated at 28 and 30, and known as LDD (lightly doped drain) regions are formed in the substrate 12. It is noted that both regions are known in the semiconductor manufacturing art as LDD (lightly doped drain) regions even though one of the regions will be adjacent to a source region. The term LDD refers to the fact that the region is lightly doped and the doping is the same as the adjacent source and drain regions. For example, if the source and drain region are n+, the LDD regions will be n−. Similarly, if the source and drain regions are p+, the LDD regions will be p−. The LDD regions, 28 and 30, define a channel region 32 in the substrate 12 under the gate oxide region 18. Source and drain regions, indicated at 34 and 36 are formed in the substrate 12. A layer of silicide, indicated at 38, such as TiSi, is formed on the source and drain regions 34 and 36, and gate 22.

Figure 2:
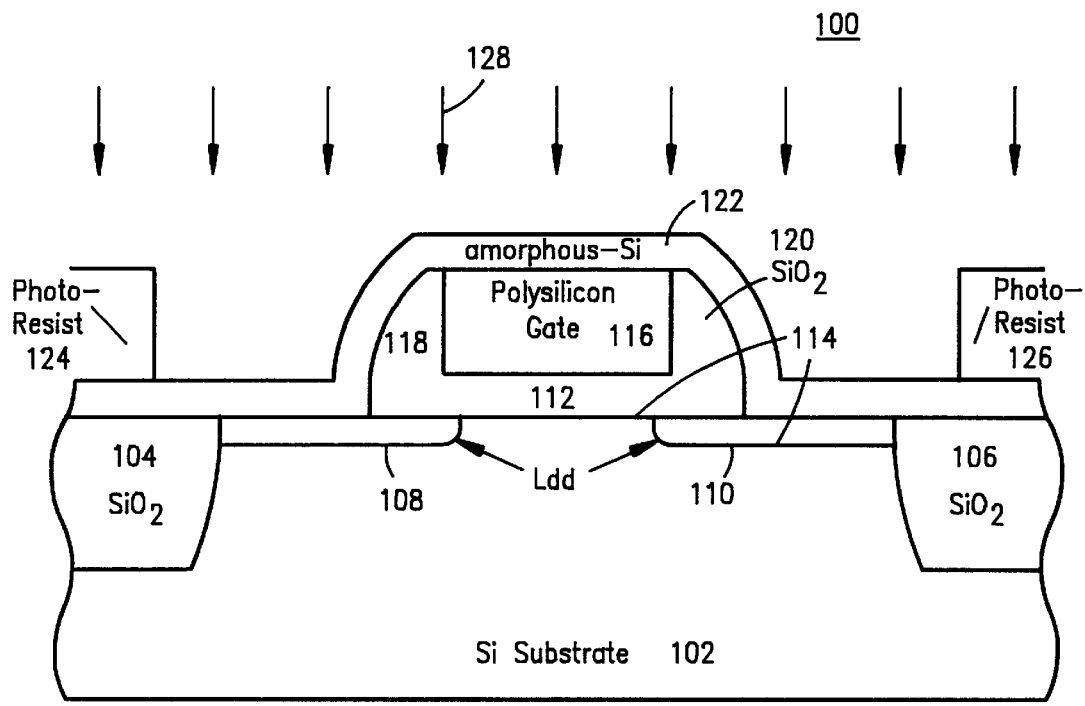
FIG. 2 shows a device with an amorphous silicon layer deposition in accordance with the present invention.

Referring to FIG. 2 there is shown a partially formed MOSFET 100 formed in a substrate 102, field oxide regions 104 and 106 formed in the substrate 102, a lightly doped drain (LDD) region 108 formed in the substrate 102, and a lightly doped drain (LDD) region 110 formed in the substrate 102. As an alternative, the LDD regions may be doped to any concentration desired. A gate oxide region 112 is formed on the surface 114 of substrate 102. A gate 116 is formed on the gate oxide region 112 and gate oxide sidewall spacers 118 and 120 are formed on both sides of gate 116. The gate oxide sidewall spacers 118 and 120 are contiguous with gate oxide region 112. It is noted that the manufacturing method and structure of the MOSFET is standard up to this point and the present invention uses this point in the manufacture of the MOSFET as the starting point.

An amorphous silicon layer 122 is deposited on the surface 114 of the substrate 102. The deposited amorphous silicon layer is about 300 Å to 1000 Å thick, which is designed to result in the subsequent consumption by about a 50% to 80% silicidation of the grown epitaxial silicon in the source and drain regions. The grown epitaxial silicon in the source and drain regions is "raised" up above the surface of the substrate 102 and serves two functions: 1) as a sacrificial thickness for the silicide formation (so that the substrate silicon is not consumed) and 2) as material for the underlying junction. Although there will be some source/drain junction diffusion into the original bulk silicon region, it will be comparable to the original LDD (or MDD or HDD) depth. Photoresist layers 124 and 126 are deposited prior to an ion implant indicated at 128. The ion implant 128 is with the appropriate dopants to form the appropriate conductivity type source and drain regions. As is known in the art, if an N-type conductivity region is desired, the ion implant is with arsenic or phosphorus ions and if a P-type conductivity region is desired, the ion implant would be with boron ions or $BF_2$ ions. Also, as is known in the art, if the source and drain regions are to be N-type conductivity, the source and drain regions are doped to be highly doped, that is, indicated by an N+. The ion implant 128 can also be done after the amorphous silicon etch step which is discussed below in conjunction with FIG. 4.

Figure 3:
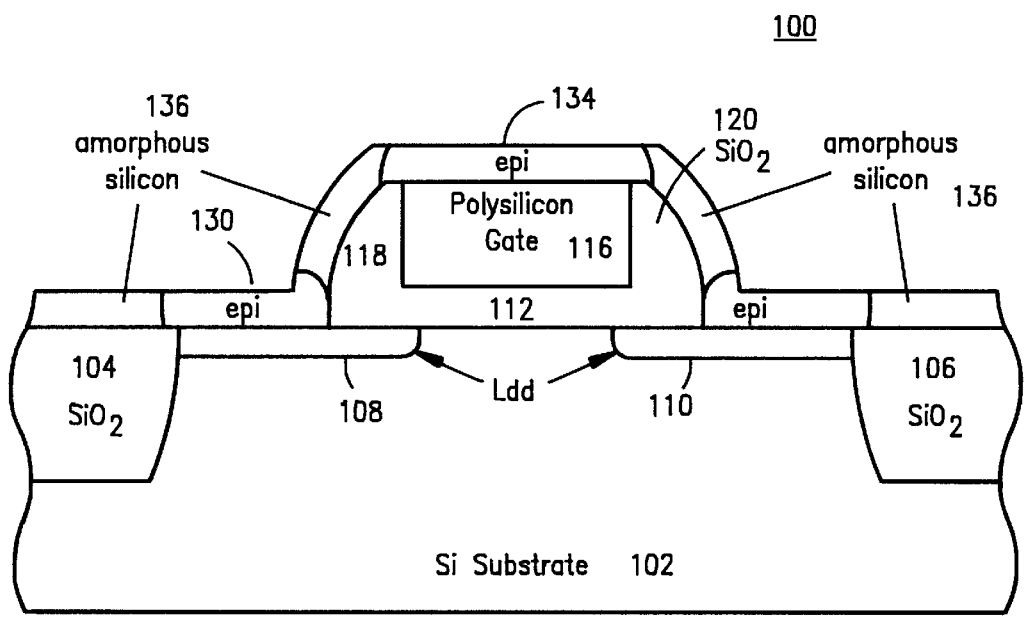
FIG. 3 shows a device with the epitaxial silicon grown in selected regions in accordance with the present invention.

Referring now to FIG. 3 the MOSFET 100 is shown after a rapid thermal anneal or furnace anneal of the device has been done. The anneal is conducted at a low to moderate temperature, in the range of 500°–950° C., which provides limited solid phase epitaxial growth (SEG) which is confined to the regions of the amorphous silicon that have silicon underneath, and in this case, there will be epitaxial silicon regions, indicated at 130 and 132, over the source/drain regions 108 and 110, respectively, and an epitaxial silicon region 134 over the polysilicon gate 116. After the rapid thermal anneal is conducted there will remain amorphous silicon regions, indicated at 136. The remaining amorphous silicon regions 136 are shown over gate oxide sidewall spacers 118 and 120 and over the field oxide regions 104 and 106.

Figure 4:
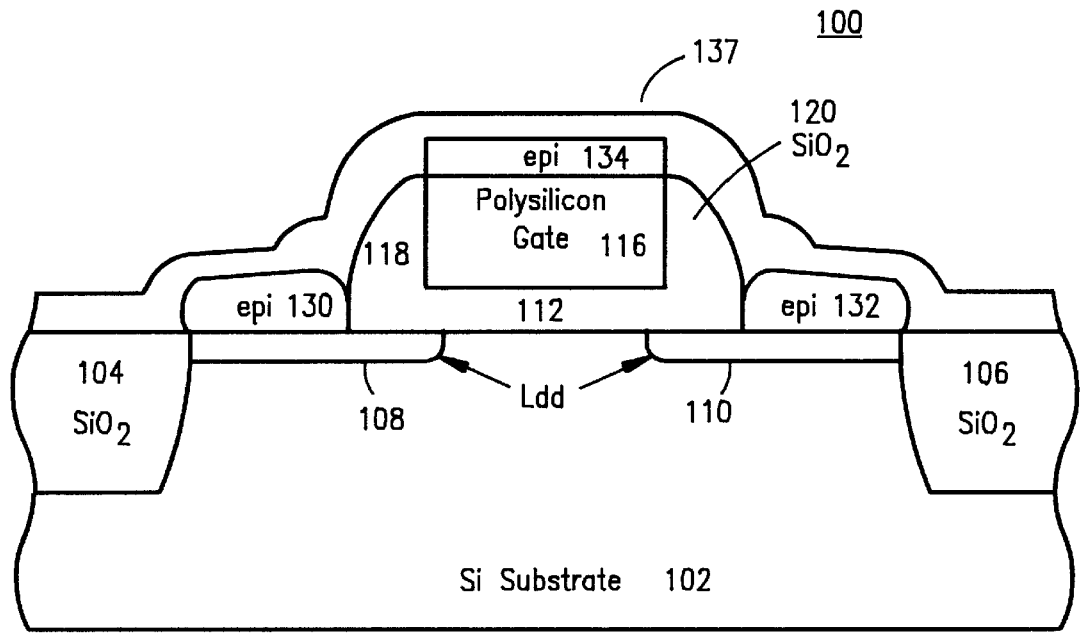
FIG. 4 shows a device with excess amorphous silicon removed and a layer of refractory metal deposition in accordance with the present invention.

Referring to FIG. 4 there is shown the MOSFET 100 after the amorphous silicon regions 136 (FIG. 3) have been removed by an etch. FIG. 4 shows a layer 137 of a refractory metal such as titanium or cobalt which is deposited on the MOSFET 100. A rapid thermal anneal is performed to form silicide. A silicide is formed during the anneal in those portions of the deposited refractory metal layer 137 that overlay the epitaxial silicon, that is, regions 130, 132, and 134.

Figure 5:
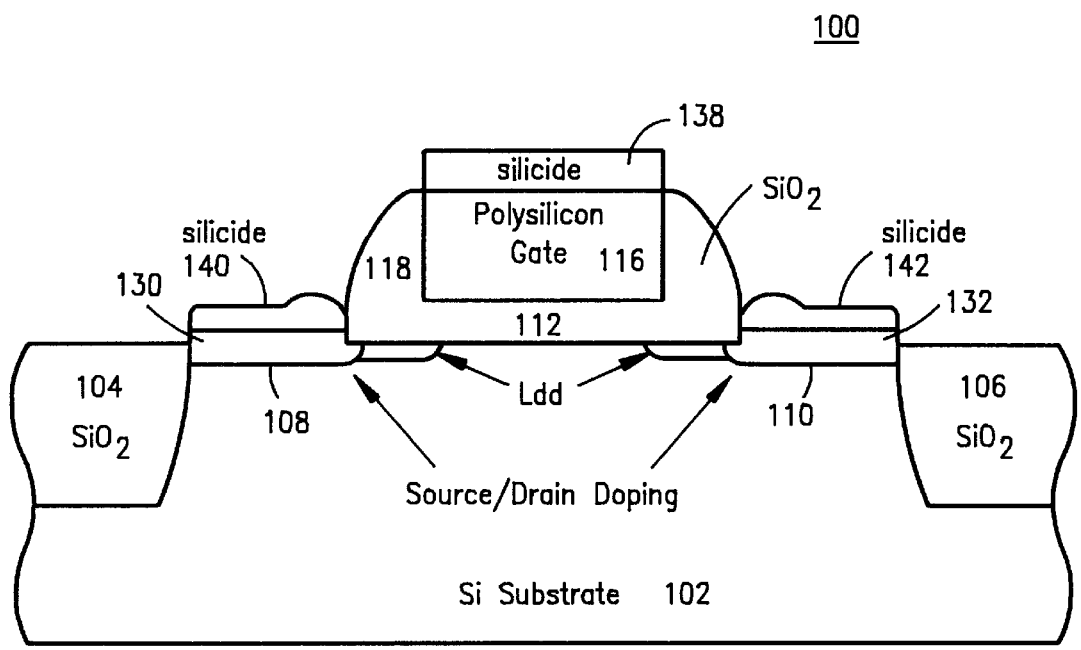
FIG. 5 shows the device with raised source/drain junction and shallow source/drain junctions in accordance with the present invention.

Referring to FIG. 5 there is shown the MOSFET 100 after an etch has removed the refractory metal that has not been converted to a silicide during the previous anneal. FIG. 5 shows that the anneal has converted the epitaxial region, indicated as 134 in FIG. 4, to a silicide region, indicated as 138, in FIG. 5. The epitaxial region 130 which is over the source region has been partially converted by the anneal to grow a silicide, indicated at 140. The epitaxial region 132 which is over the drain region has been partially converted by the anneal to grow a silicide, indicated at 142.

The results of the above process is that the source and drain regions have been raised above the surface of the substrate and the source and drain junctions are narrow, both of which increases the performance of the MOSFET.

The foregoing description of the preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications which are suited to the particular use contemplated. All such modifications and variations are within the scope of the invention as determined by the appended claims when interpreted in accordance with the breadth to which they are fairly, legally, and equitably entitled.

What we claim is:

1. A method of manufacturing a MOSFET, wherein the method comprises:

forming a source region and a drain region in a substrate;

forming a gate oxide region on a surface of the substrate;

forming a gate on the gate oxide region;

forming gate oxide spacers adjacent to the gate and contiguous with the gate oxide region;

depositing undoped amorphous silicon;

ion implanting wherein the source and drain junctions are formed;

a first rapid thermal anneal wherein limited solid phase epitaxial silicon growth takes place in regions of the amorphous silicon with underlying silicon; and etching the remaining amorphous silicon.

2. The method of claim 1, wherein the method further comprises depositing a refractive metal.

3. The method of claim 2, wherein the method further comprises a second rapid thermal anneal wherein silicide is formed in regions of the refractory metal with underlying epitaxial silicon.

4. The method of claim 3, wherein the method further comprises etching the remaining refractory metal that has not formed a silicide.

5. A method of manufacturing a MOSFET, wherein the method comprises:

forming a source region and a drain region in a substrate;

forming a gate oxide region on a surface of the substrate;

forming a gate on the gate oxide region;

forming gate oxide spacers adjacent to the gate and contiguous with the gate oxide region;

depositing undoped amorphous silicon;

a first rapid thermal anneal wherein limited solid phase epitaxial silicon growth takes place in regions of the amorphous silicon with underlying silicon;

etching the remaining amorphous silicon; and ion implanting wherein the source and drain junctions are formed.

6. The method of claim 5, wherein the method further comprises depositing a refractory metal.

7. The method of claim 6, wherein the method further comprises a second rapid thermal anneal wherein silicide is formed in regions of the refractory metal with underlying epitaxial silicon.

8. The method of claim 7, wherein the method further comprises etching the remaining refractory metal that has not formed a silicide.

\* \* \* \* \*